US011431929B2

United States Patent
Kobayashi et al.

(10) Patent No.: US 11,431,929 B2
(45) Date of Patent: Aug. 30, 2022

(54) PHOTOELECTRIC CONVERSION DEVICE AND EQUIPMENT

(71) Applicant: CANON KABUSHIKI KAISHA, Tokyo (JP)

(72) Inventors: Hideo Kobayashi, Tokyo (JP); Daisuke Yoshida, Ebina (JP); Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 86 days.

(21) Appl. No.: 16/928,202

(22) Filed: Jul. 14, 2020

(65) Prior Publication Data

US 2021/0021777 A1    Jan. 21, 2021

(30) Foreign Application Priority Data

Jul. 18, 2019 (JP) .............................. JP2019-133125

(51) Int. Cl.
*H04N 5/369* (2011.01)
*H04N 5/378* (2011.01)
*H04N 5/359* (2011.01)
*H01L 27/146* (2006.01)

(52) U.S. Cl.
CPC ......... *H04N 5/3698* (2013.01); *H04N 5/3598* (2013.01); *H04N 5/378* (2013.01); *H04N 5/379* (2018.08); *H01L 27/14634* (2013.01); *H01L 27/14636* (2013.01)

(58) Field of Classification Search
CPC .. H04N 5/3598; H04N 5/3658; H04N 5/3698; H04N 5/378; H04N 5/379; H01L 27/14634; H01L 27/14636
See application file for complete search history.

(56) References Cited

U.S. PATENT DOCUMENTS

| 7,227,208 | B2 | 6/2007 | Ogura et al. |
| 7,561,199 | B2 | 7/2009 | Noda et al. |
| 7,719,587 | B2 | 5/2010 | Ogura et al. |
| 7,990,440 | B2 | 8/2011 | Kobayashi et al. |
| 8,259,205 | B2 | 9/2012 | Noda et al. |
| 8,400,546 | B2 | 3/2013 | Itano et al. |
| 8,698,062 | B2 | 4/2014 | Koshida |

(Continued)

FOREIGN PATENT DOCUMENTS

| JP | 2012-257037 A | 12/2012 |
| JP | 2014-154975 A | 8/2014 |
| JP | 2017-117828 A | 6/2017 |

*Primary Examiner* — Lin Ye
*Assistant Examiner* — Chriss S Yoder, III
(74) *Attorney, Agent, or Firm* — Venable LLP

(57) ABSTRACT

Photoelectric conversion device includes stacked first and second substrates. The first substrate includes pixel array, first joint portion arranged in the pixel array and connected to pixels in the pixel array, and power supply pad connected to the first joint portion. The second substrate includes readout circuit to read signal from the pixel array via signal line, and second joint portion jointed to the first joint portion. The readout circuit includes limiter circuit to limit amplitude of potential of the signal line. Power supply terminal of the limiter circuit is connected to the second joint portion, and power supply potential applied to the power supply pad is supplied to the pixels and supplied to the power supply terminal of the limiter circuit via the first and second joint portions.

16 Claims, 13 Drawing Sheets

(56) References Cited

U.S. PATENT DOCUMENTS

| | | |
|---|---|---|
| 8,710,558 B2 | 4/2014 | Inoue et al. |
| 8,835,828 B2 | 9/2014 | Kobayashi |
| 8,884,391 B2 | 11/2014 | Fudaba et al. |
| 8,952,433 B2 | 2/2015 | Inui |
| 9,159,750 B2 | 10/2015 | Ikeda et al. |
| 9,264,641 B2 | 2/2016 | Kobayashi |
| 9,305,954 B2 | 4/2016 | Kato et al. |
| 9,407,847 B2 | 4/2016 | Maehashi et al. |
| 9,350,958 B2 | 5/2016 | Totsuka et al. |
| 9,357,122 B2 | 5/2016 | Kususaki et al. |
| 9,407,839 B2 | 8/2016 | Yoshida |
| 9,438,828 B2 | 9/2016 | Itano et al. |
| 9,509,931 B2 | 11/2016 | Kobayashi et al. |
| 9,538,112 B2 | 1/2017 | Wada et al. |
| 9,602,752 B2 | 3/2017 | Kobayashi et al. |
| 9,787,926 B2 | 10/2017 | Yoshida |
| 9,787,927 B2 | 10/2017 | Yoshida |
| 9,787,932 B2 | 10/2017 | Totsuka et al. |
| 9,838,633 B2 | 12/2017 | Muto et al. |
| 9,838,637 B2 | 12/2017 | Muto et al. |
| 9,876,975 B2 | 1/2018 | Yoshida et al. |
| 10,003,761 B2 | 6/2018 | Totsuka et al. |
| 10,015,430 B2 | 7/2018 | Kobayashi et al. |
| 10,171,761 B2* | 1/2019 | Hanzawa ............... H04N 5/359 |
| 10,321,087 B2 | 6/2019 | Yoshida et al. |
| 10,347,679 B2 | 7/2019 | Kato et al. |
| 10,424,613 B2 | 9/2019 | Tsuboi et al. |
| 10,594,971 B2 | 3/2020 | Totsuka et al. |
| 10,609,316 B2 | 3/2020 | Kobayashi |
| 10,917,602 B2* | 2/2021 | Tsukuda ............ H01L 27/14634 |
| 2012/0056251 A1* | 3/2012 | Kudoh ............. H01L 27/14612 |
| | | 257/292 |
| 2012/0133808 A1* | 5/2012 | Park ........................ G01J 1/46 |
| | | 348/294 |
| 2012/0175503 A1 | 7/2012 | Kuroda et al. |
| 2013/0140440 A1 | 6/2013 | Kobayashi |
| 2015/0062367 A1 | 3/2015 | Inui |
| 2015/0341582 A1 | 11/2015 | Sakaguchi |
| 2016/0227141 A1 | 8/2016 | Kobayashi et al. |
| 2016/0301886 A1 | 10/2016 | Muto et al. |
| 2018/0376093 A1 | 12/2018 | Tsukuda et al. |
| 2020/0029044 A1 | 1/2020 | Inui |
| 2020/0194491 A1 | 6/2020 | Inui et al. |
| 2020/0273894 A1 | 8/2020 | Inui et al. |
| 2020/0378828 A1* | 12/2020 | Kobayashi ........ H01L 27/14634 |
| 2021/0385403 A1* | 12/2021 | Eki .................... H04N 5/37452 |

* cited by examiner

PHOTOELECTRIC CONVERSION DEVICE AND EQUIPMENT

BACKGROUND OF THE INVENTION

Field of the Invention

The present invention relates to a photoelectric conversion device and an equipment.

Description of the Related Art

Japanese Patent Laid-Open No. 2012-257037 describes an image sensor in which a pixel chip and a pixel signal processing chip are stacked. The pixel chip includes a plurality of pixels, and the pixel signal processing chip performs temporary storage of an electric signal transmitted from the pixel chip and an operation or the like on the electric signal. The pixel signal processing chip includes a pixel memory clip reference transistor connected to a pixel memory signal line connected to a pixel signal line of the pixel. The pixel memory clip reference transistor limits the voltage of the pixel memory signal line based on the potential of the pixel memory clip reference pulse. The pixel memory clip reference transistor suppresses a darkening phenomenon and a horizontal line phenomenon caused by the pixel with high-luminance light entering thereon.

When high-luminance light enters, charges generated in the photoelectric converter leak into a floating diffusion, and the potential of the floating diffusion decreases. In accordance with this, the potential of the signal line driven by the amplification transistor decreases, and the amplification transistor is turned off eventually. The limiter circuit (the pixel memory clip reference transistor in Japanese Patent Laid-Open No. 2012-257037) that limits the potential of the signal line is rendered conductive when the potential of the signal line decreases to a predetermined level due to entry of high-luminance light. In such an operation, the fluctuation of the current flowing from the power supply line of the pixel to the signal line through the amplification transistor is large, so that the fluctuation of the potential of the power supply terminal of the pixel is also large. Therefore, the quality of the captured image can be deteriorated.

SUMMARY OF THE INVENTION

The present invention provides a technique advantageous in suppressing a deterioration in quality of a captured image.

One of aspects of the present invention provides a photoelectric conversion device including a first substrate and a second substrate stacked on each other, wherein the first substrate includes a pixel array having a plurality of pixels, a first joint portion arranged in the pixel array and connected to at least one pixel of the plurality of pixels on the first substrate, and a power supply pad connected to the first joint portion, the second substrate includes a readout circuit configured to read out a signal from the pixel array via a signal line, and a second joint portion jointed to the first joint portion, the readout circuit includes a limiter circuit configured to limit an amplitude of a potential of the signal line, and a power supply terminal of the limiter circuit is connected to the second joint portion, and a power supply potential applied to the power supply pad is supplied to the at least one pixel and supplied to the power supply terminal of the limiter circuit via the first joint portion and the second joint portion.

Further features of the present invention will become apparent from the following description of exemplary embodiments with reference to the attached drawings.

DESCRIPTION OF THE EMBODIMENTS

Figure 1:
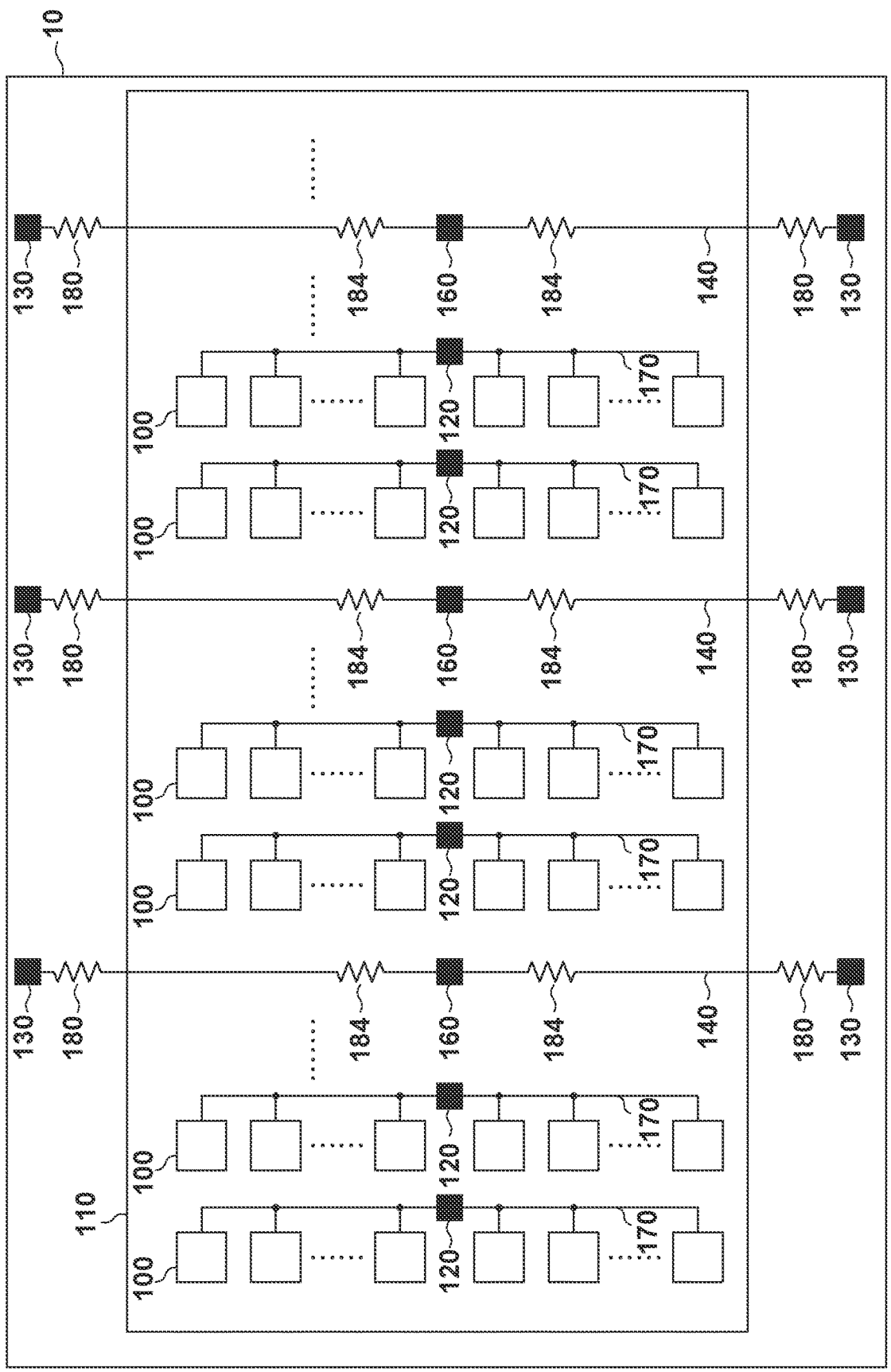
FIG. 1 is a view exemplarily showing the arrangement of a first substrate forming a photoelectric conversion device according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the following description, a "connection" means an electrical connection. A connection (electrical connection) between two elements can include, in addition to a direct connection between the two elements, a connection between the two elements via another element. "Joining" provides an electrical connection.

Figure 2:
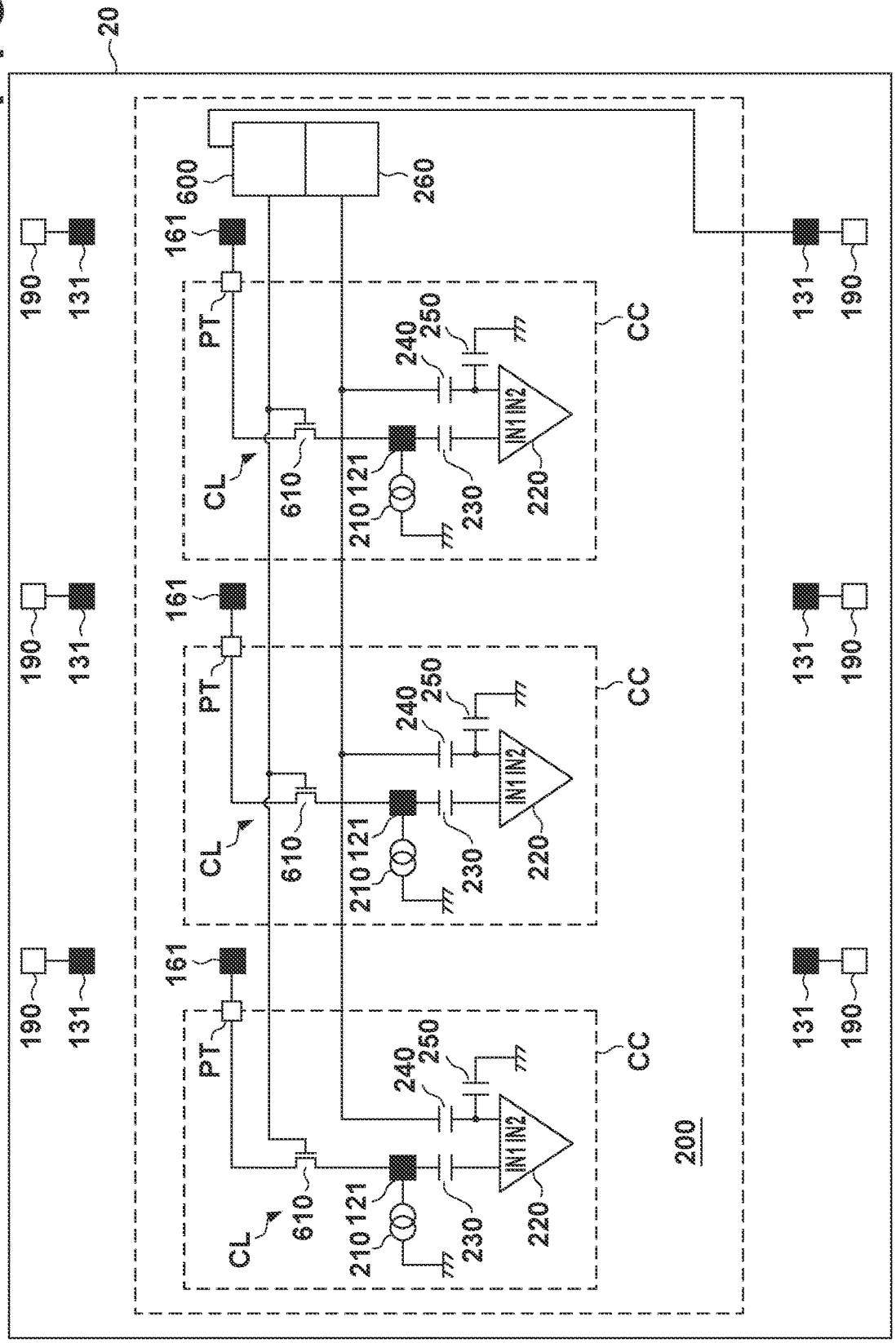
FIG. 2 is a view exemplarily showing the arrangement of a second substrate forming the photoelectric conversion device according to the first embodiment.
Figure 3:
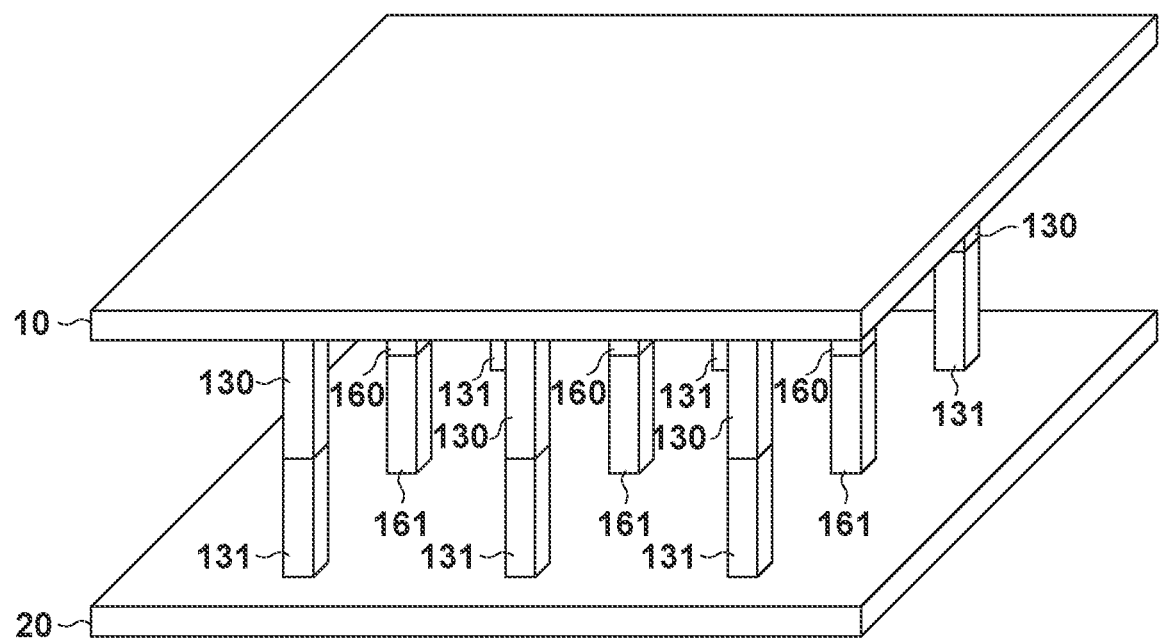
FIG. 3 is a view schematically showing the arrangement of the photoelectric conversion device according to the first embodiment.

With reference to FIGS. 1 to 4, a photoelectric conversion device 1 according to the first embodiment will be described. As schematically shown in FIG. 3, the photoelectric conversion device 1 according to the first embodiment can be formed by stacking a first substrate 10 and a second substrate 20. A joint portion 130 provided on the first substrate 10 and a joint portion 131 provided on the second substrate 20 can be joined to each other. A power supply potential (VDD) can be applied to the joint portions 130 and 131 from a power supply pad. A joint portion 160 provided on the first substrate 10 and a joint portion 161 provided on the second substrate 20 can be joined to each other. The power supply potential can be applied to the joint portions 160 and 161 from the power supply pad via an electrically conductive line in a pixel array.

FIG. 1 schematically shows an arrangement example of the first substrate 10, and FIG. 2 schematically shows an arrangement example of the second substrate 20. The first substrate 10 includes a pixel array 110 having a plurality of pixels 100 so as to form a plurality of rows and a plurality of columns. The first substrate 10 further includes the joint portion (first joint portion) 160 arranged in the pixel array 110 and connected to at least one pixel 100 of the plurality of pixels 100 on the first substrate 10. The second substrate 20 includes a readout circuit 200 that reads out a signal from the pixel array 110 of the first substrate 10, and the joint portion (second joint portion) 161 jointed to the joint portion 160. A plurality of column signal lines (signal lines) 170 are arranged in the pixel array 110. The pixels 100 of the number corresponding to the number of rows in the pixel array 110 can be connected to each column signal line 170.

The column signal line 170 is connected to a joint portion 120. The joint portion 120 is connected to a joint portion 121 provided on the second substrate 20. Although the joint portions 120 and 121 are not shown in FIG. 3, the joint portions 120 and 121 are joined in a form similar to the joining between the joint portions 160 and 161. The joint portions 120 and 121 can be used to connect the column signal line 170 in the pixel array 110 of the first substrate 10 to the readout circuit 200 of the second substrate 20. The first substrate 10 can include the joint portion 130 to which the power supply potential is applied, and the joint portion (first joint portion) 160 to which the power supply potential is applied. The second substrate 20 can include the joint portion 131 to which the power supply potential is applied, and the joint portion (second joint portion) 161 to which the power supply potential is applied. The joint portion 130 of the first substrate 10 and the joint portion 131 of the second substrate 20 can be connected to each other. The joint portion 160 of the first substrate 10 and the joint portion 161 of the second substrate 20 can be connected to each other.

The joint portion 130 is arranged outside the pixel array 110 and connected to an electrically conductive line (power supply line) 140, and the joint portion 160 is arranged in the pixel array 110 and connected to the electrically conductive line 140. That is, the joint portion 130 and the joint portion 160 are connected to each other by the electrically conductive line 140. A resistance 180 and resistances 184 can be parasitic on the electrically conductive line 140. The resistance 180 is a resistance of the electrically conductive line 140 outside the pixel array 110, and the resistance 184 is a resistance of the electrically conductive line 140 in the pixel array 110 between the end portion of the pixel array 110 and the joint portion 160.

The second substrate 20 includes the readout circuit 200 that reads out a signal from the pixel array 110, and the readout circuit 200 can include a plurality of column circuits CC provided such that one column circuit CC corresponds to one column signal line 170. In FIG. 2, only three of such column circuits CC are shown. The second substrate 20 can include a power supply pad 190 for externally applying the power supply potential to the joint portion 131. Here, a plurality of the power supply pads 190 can be provided such that one power supply pad 190 corresponds to one joint portion 131.

The readout circuit 200 (column circuit CC) can be configured to read out a signal from the pixel 100 via the column signal line 170 and the joint portions 120 and 121. In another aspect, the readout circuit 200 (column circuit CC) can be configured to process a signal provided from the pixel 100 via the column signal line 170 and the joint portions 120 and 121. The readout circuit 200 (column circuit CC) can include a power supply terminal PT to which the power supply potential is supplied from the power supply pad 190 via the electrically conductive line 140 arranged in the pixel array 110 (and via the joint portions 131, 130, 160, and 161).

For example, the readout circuit 200 (column circuit CC) can be configured to operate as an AD converter that generates a digital signal corresponding to a signal (analog signal) provided from the pixel 100 via the column signal line 170 and the joint portions 120 and 121. The readout circuit 200 can include, for example, a current source 210, a differential amplifier (comparator) 220, a first capacitor 230, a second capacitor 240, and a third capacitor 250. The readout circuit 200 can include a supply source 260 that supplies a ramp signal as a reference potential to each column circuit CC.

The differential amplifier 220 includes a first input terminal IN1 and a second input terminal IN2. The current source 210 is arranged in a path connecting the column signal line 170 of the pixel array 110 (the joint portion 121 connected to the column signal line 170) and a ground potential. The first capacitor 230 is arranged in a path connecting the column signal line 170 (the joint 121 connected thereto) and the first input terminal IN1. The second capacitor 240 is arranged in a path connecting the supply source 260 of a ramp signal as a reference potential and the second input terminal IN2. The third capacitor 250 is arranged in a path connecting the second input terminal IN2 and the ground potential. Although not shown, the readout circuit 200 includes a counter that starts counting at the start of AD conversion and generates a count value. In addition, the column circuit CC includes a memory which is connected to the output terminal of the differential amplifier (comparator) 220 and to which the count value is input from the counter. The memory holds the count value in accordance with the inversion of the output of the differential amplifier (comparator) 220. This count value serves as a digital signal corresponding to the signal of the pixel 100. Note that the arrangement of the AD converter is not limited to this example and, for example, a counter connected to the output terminal of the differential amplifier (comparator) 220 may be provided in each column circuit CC. In this case, the counter stops counting in accordance with the inversion of the output of the differential amplifier (comparator) 220. Thus, a digital signal corresponding to the signal of the pixel 100 is generated by the counter.

The readout circuit 200 can include a clip circuit CL (limiter circuit) which is connected to the column signal line 170 via the joint portions 120 and 121 and limits the amplitude of the potential of the column signal line 170. For example, the clip circuit CL can include a transistor (clip transistor) 610 arranged so as to form a path connecting the power supply terminal PT and the column signal line 170 (joint portion 121). The pixel 100 to which the joint portion 160 is connected and the clip circuit CL in which the second joint portion 161 is connected to the power supply terminal PT can be connected to the same column signal line 170. The photoelectric conversion device 1 may include an adjuster 600 which adjusts the driving capability of the clip circuit CL. The adjuster 600 can be arranged on the second substrate 20. The adjuster 600 can be supplied with the power supply potential through the power supply pad 190 arranged on the second substrate 20. The adjuster 600 can be configured to adjust a bias potential applied to the gate of the transistor 610.

Figure 4:
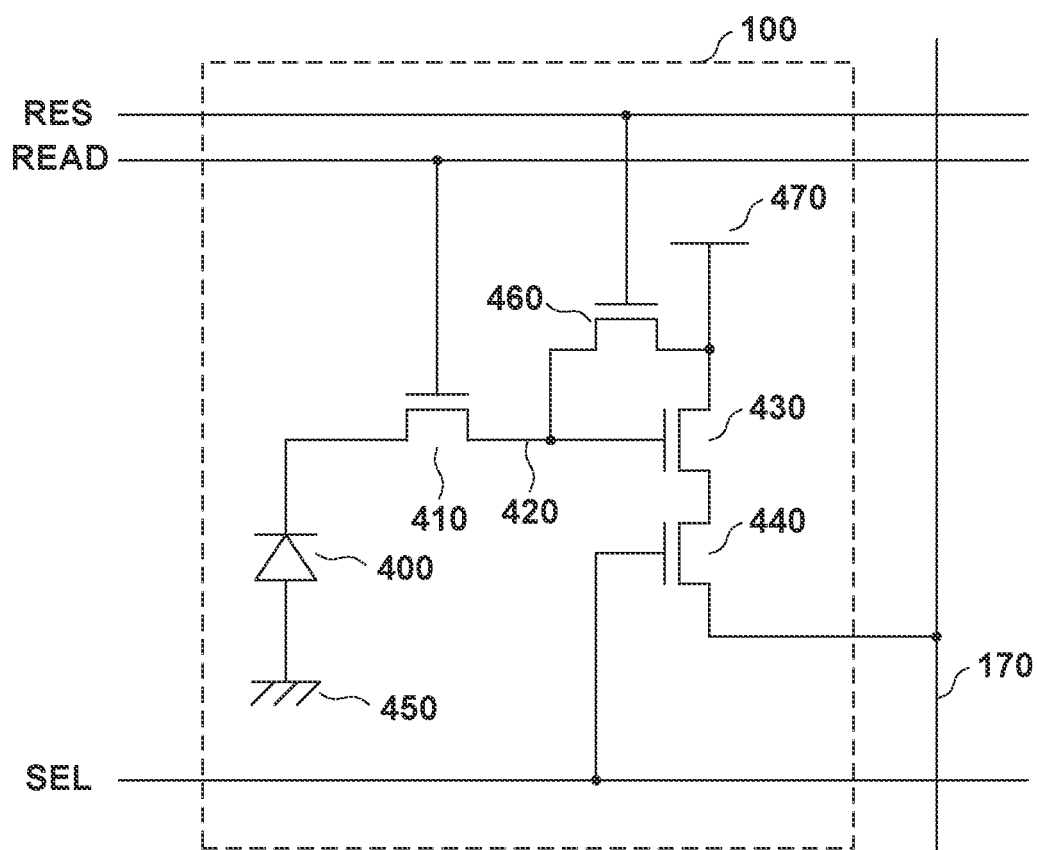
FIG. 4 is a view exemplarily showing the arrangement of a pixel in the photoelectric conversion device according to the first embodiment.

FIG. 4 shows an arrangement example of one pixel 100 arranged in the pixel array 110 of the first substrate 10. The pixel 100 can include, for example, a photoelectric converter 400, a transfer transistor 410, a charge-voltage converter (floating diffusion) 420, a source follower transistor (amplification transistor) 430, and a reset transistor 460. The photoelectric converter 400 is formed by, for example, a photodiode whose anode is connected to a ground line 450, and can photoelectrically convert incident light and accumulate generated charges. When a readout signal READ driven by a row drive circuit (not shown) is set at an active level, the transfer transistor 410 can transfer the charges accumulated in the photoelectric converter 400 to the charge-voltage converter 420. A potential corresponding to the amount of transferred charges appears in the charge-voltage converter 420. The source follower transistor 430 forms a source follower circuit together with the current source 210 connected to the column signal line 170, and outputs a signal corresponding to the potential of the charge-voltage converter 420 to the column signal line 170. The source follower transistor 430 is arranged so as to connect a power supply line 470, to which the power supply potential is supplied via the joint portion 160, to the column signal line 170. When a reset signal RES drives by the row drive circuit is set at an active level, the reset transistor 460 resets the potential of the charge-voltage converter 420.

The pixel 100 can further include a selection transistor 440. When a selection signal SEL driven by the row drive circuit is set at an active level (that is, when the pixel 100 is selected), the selection transistor 440 is turned on to enable driving of the column signal line 170 by the source follower transistor 430. The selection transistor 440 can be omitted. When the selection transistor 440 is omitted, the pixel 100 can be controlled to a selected state or a non-selected state by controlling the potential of the charge-voltage converter 420 to be reset by the reset transistor 460.

An operation of reading out a signal from the pixel 100 will be described with reference to FIG. 2. A signal of the pixel 100 that appears in the column signal line 170 is supplied to one terminal of the first capacitor 230 of the column circuit CC via the joint portions 120 and 121. On the other hand, a ramp signal as a reference potential generated by the supply source 260 is supplied to one terminal of the second capacitor 240 of the column circuit CC. The differential amplifier 220 operates as a comparator. The slope of the ramp signal supplied from the supply source 260 to the column circuit CC depends on the capacitance ratio between the third capacitor 250 and the second capacitor 240. The larger the capacitance of the third capacitor 250 than the capacitance of the second capacitor 240, the larger the slope of the ramp signal supplied to the differential amplifier 220. In other words, the larger the capacitance of the third capacitor 250 than the capacitance of the second capacitor 240, the larger the gain of AD conversion. By making the capacitance value of the third capacitor 250 and/or the second capacitor 240 variable, the gain of AD conversion may be made variable.

In one example, the ramp signal is generated such that its potential gradually decreases. When the potential of the second input terminal IN2 falls below the potential of the first input terminal IN1, the output signal of the differential amplifier 220 as the comparator is inverted, and this stops counting by the above-mentioned counter. Accordingly, the signal of the pixel 100 is read out as a digital signal.

A supply form of the power supply potential will be described below. The power supply pad 190 can be arranged on the second substrate 20. The power supply potential supplied to the power supply pad 190 can be supplied to the electrically conductive line (power supply line) 140 of the first substrate 10 via the joint portions 131 and 130. Here, a plurality of the power supply pads 190 can be arranged on the second substrate 20, and a plurality of the joint portions 131, a plurality of the joint portions 130, and a plurality of the electrically conductive lines 140 can be provided correspondingly. The power supply potential supplied to the electrically conductive line 140 of the first substrate 10 is supplied to the power supply line 470 (see FIG. 4) of the pixel 100 of the pixels corresponding to the electrically conductive line 140. In addition, the power supply potential supplied to the pixel array 110 is further supplied to the power supply terminal PT of the clip circuit CL of the second substrate 20 via the joint portions 160 and 161.

The transistor 610 forming the clip circuit CL can operate so as to suppress an excessive decrease in potential of the column signal line 170. This operation will be referred to as a clip operation hereinafter. In FIG. 2, by supplying the power supply potential to the drain of the transistor 610 via the electrically conductive line 140 extending through the pixel array 110 of the first substrate 10, it is possible to reduce the potential change of the power supply line 470 which occurs when the clip operation is performed. More specifically, when high-luminance light enters the pixel 100, a phenomenon (blooming) occurs in which charges generated in the photoelectric converter 400 overflow into the charge-voltage converter 420. This causes a decrease in potential of the charge-voltage converter 420, and the potential of the column signal line 170 also decreases. In response to this, the source follower transistor 430 is turned off and the transistor 610 is turned on to prevent an excessive decrease in potential of the column signal line 170. At this time, the current supplied to the power supply line 470 of the pixel 100 via the resistance 180 flows into the transistor 610 via the resistance 180. Accordingly, the potential change of the power supply line 470 which occurs when the clip operation is performed is reduced. Thus, a deterioration in image quality caused by the clip circuit CL is suppressed. For example, it is possible to suppress a phenomenon in which the power supply potential of the power supply line 470 of another pixel fluctuates due to the pixel in which blooming occurs, and the fluctuation of the power supply potential is transmitted to the charge-voltage converter 420 as noise, resulting in a deterioration in image quality.

In addition, the arrangement in which the power supply potential is supplied, through the power supply pad 190 arranged on the second substrate 20, to the adjuster 600 which adjusts the bias potential applied to the gate of the transistor 610 is advantageous in reducing shading. On the other hand, in the arrangement in which the power supply potential is supplied to the adjuster 600 via the electrically conductive line 140 (and the joint portions 160 and 161) arranged on the first substrate 10, the current flowing through the electrically conductive line 140 becomes large. In this case, shading may occur.

Accordingly, the power supply potential supplied to the power supply line 470 of the pixel 100 fluctuates, and the reset potential of the charge-voltage converter 420 varies. This can cause shading.

In the example shown in FIGS. 1 and 2, the joint portions 160 and 161 are arranged for every plurality of columns, but the joint portions 160 and 161 may be arranged for each column. In addition, the common power supply pad 190 may be used to supply the power supply potential to the adjuster 600 and to supply the power supply potential to the electrically conductive line 140. In this case, the number of the power supply pads 190 can be reduced.

Figure 5:
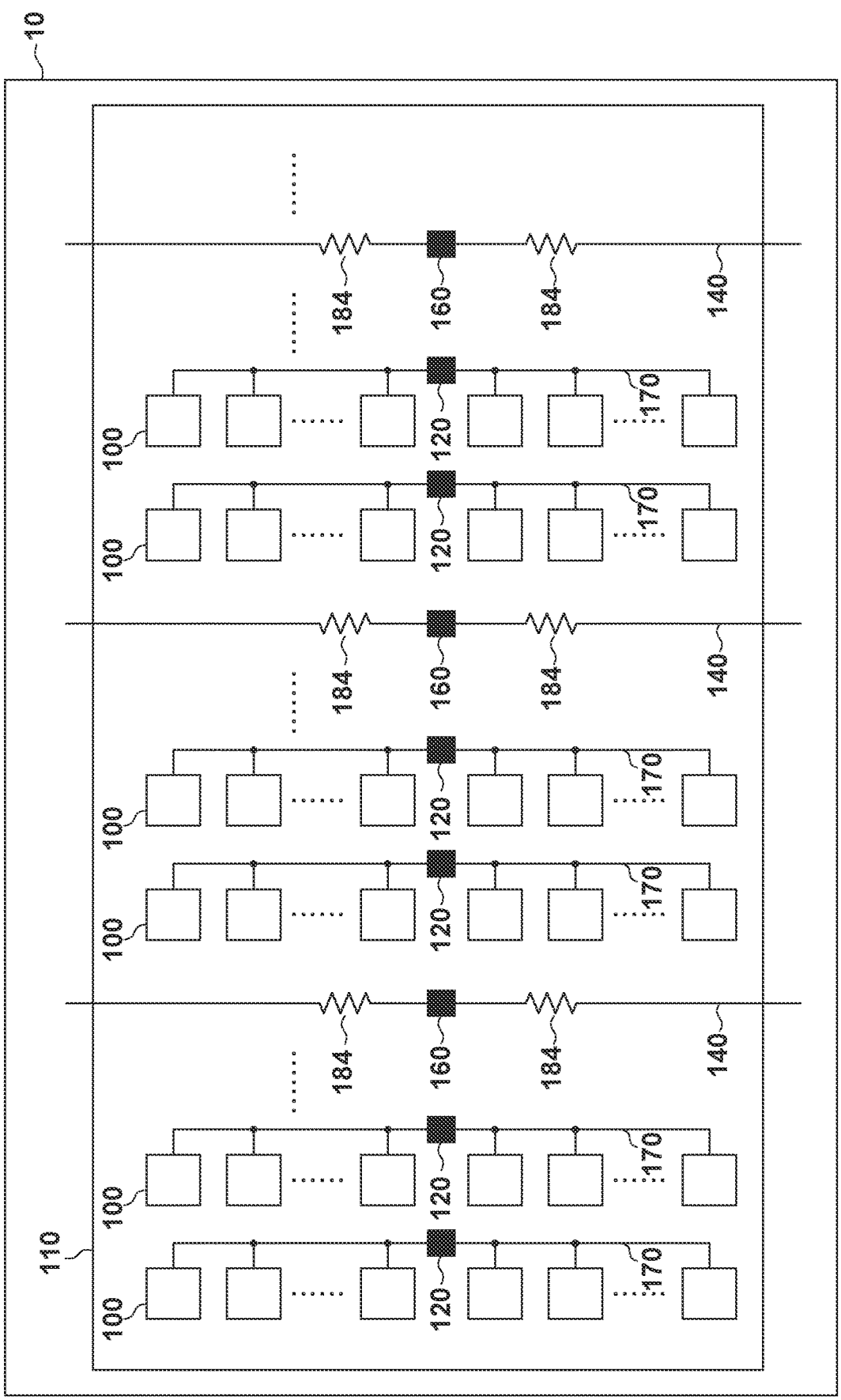
FIG. 5 is a view exemplarily showing the arrangement of a first substrate forming a photoelectric conversion device according to the second embodiment.
Figure 6:
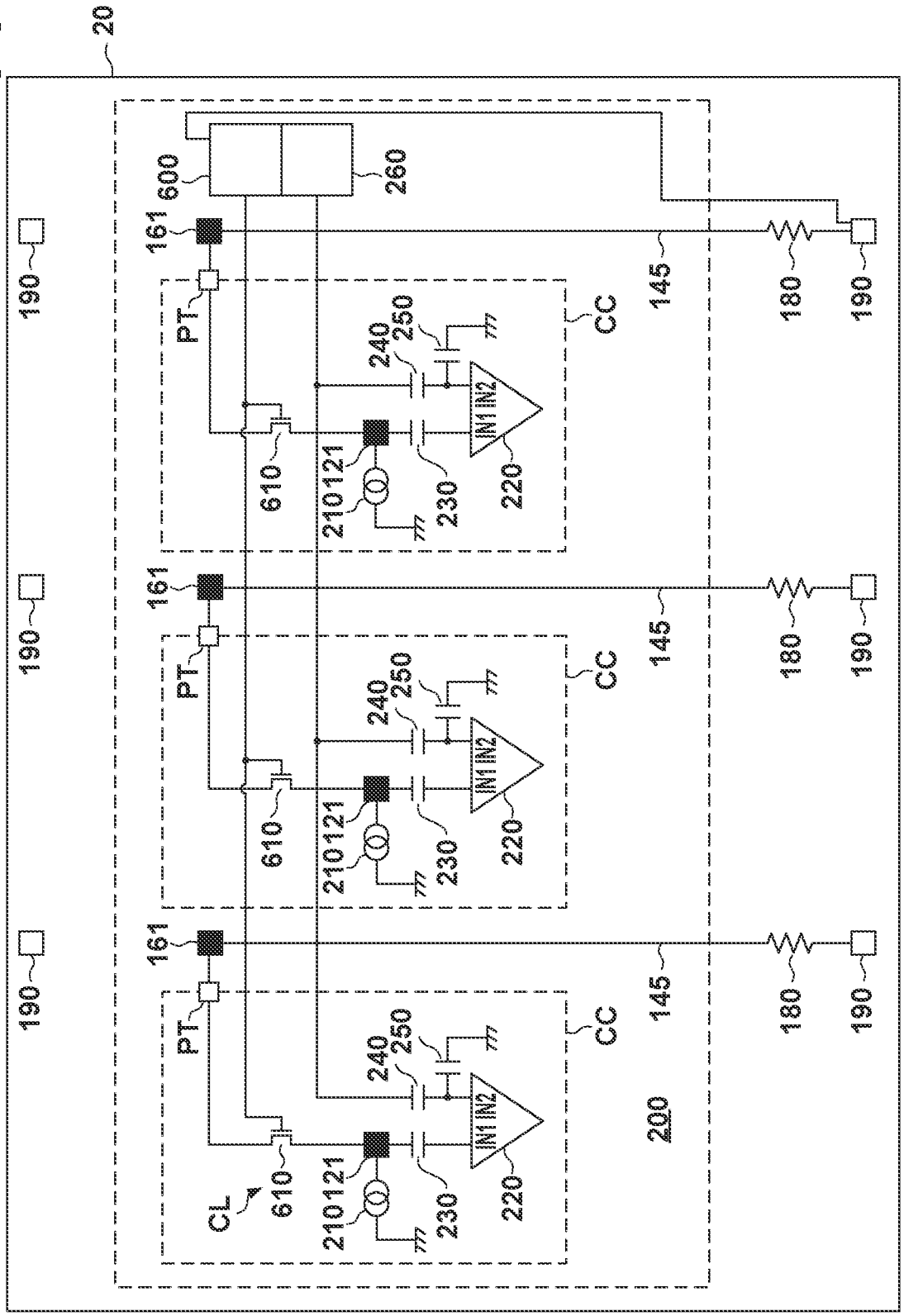
FIG. 6 is a view exemplarily showing the arrangement of a second substrate forming the photoelectric conversion device according to the second embodiment.

With reference to FIGS. 5 and 6, a photoelectric conversion device 1 according to the second embodiment will be described below. Matters not mentioned as the second embodiment can follow the first embodiment. In the second embodiment, a second substrate 20 includes a power supply pad 190 connected to a joint portion 161 through an electrically conductive line 145 on the second substrate 20. A power supply potential applied to the power supply pad 190 is supplied to a clip circuit CL by the electrically conductive line 145 of the second substrate 20 and supplied to a pixel 100 of a first substrate 10 via a joint portion 161 and the joint portion 160. The pixel 100 to which the joint portion 160 is connected and the clip circuit CL in which the second joint portion 161 is connected to a power supply terminal PT can be connected to a single column signal line 170.

Also in the second embodiment, a deterioration in image quality caused by the clip circuit CL is suppressed. For example, it is possible to suppress a phenomenon in which the power supply potential of a power supply line 470 of another pixel fluctuates due to the pixel in which blooming occurs, and the fluctuation of power supply potential is transmitted to a charge-voltage converter 420 as noise, resulting in a deterioration in image quality.

Figure 7:
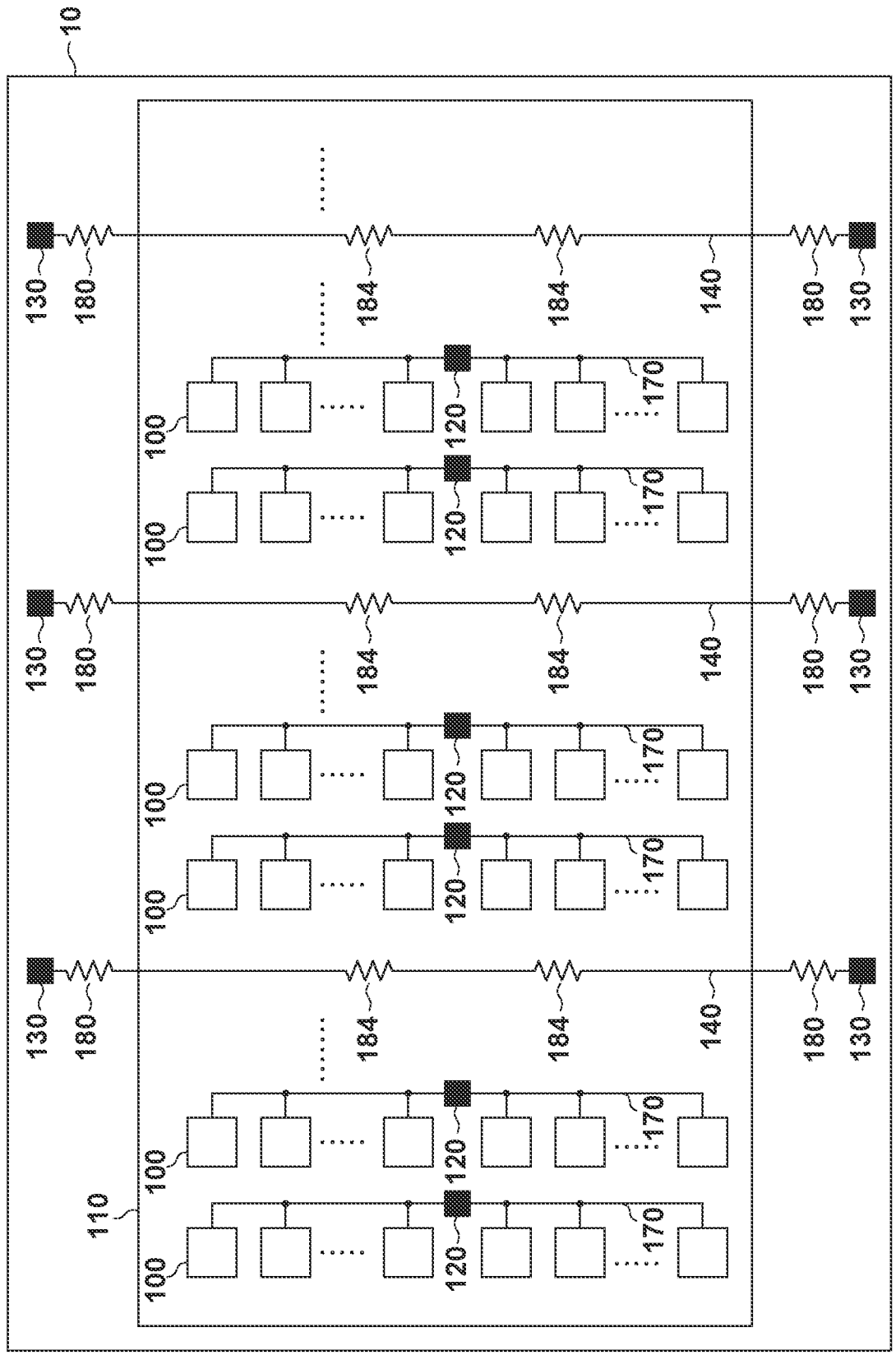
FIG. 7 is a view exemplarily showing the arrangement of a first substrate forming a photoelectric conversion device according to the third embodiment.
Figure 8:
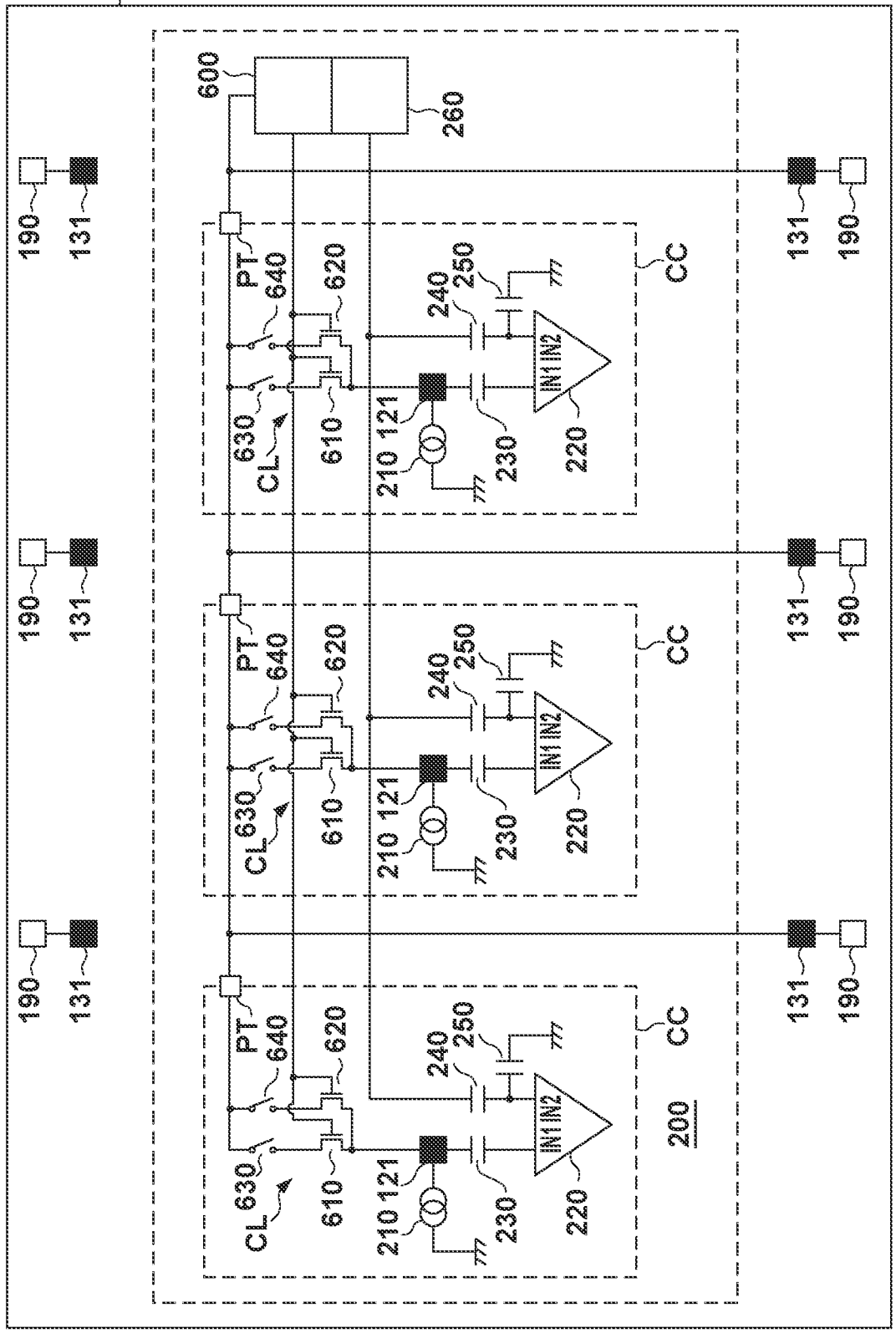
FIG. 8 is a view exemplarily showing the arrangement of a second substrate forming the photoelectric conversion device according to the third embodiment.
Figure 9:
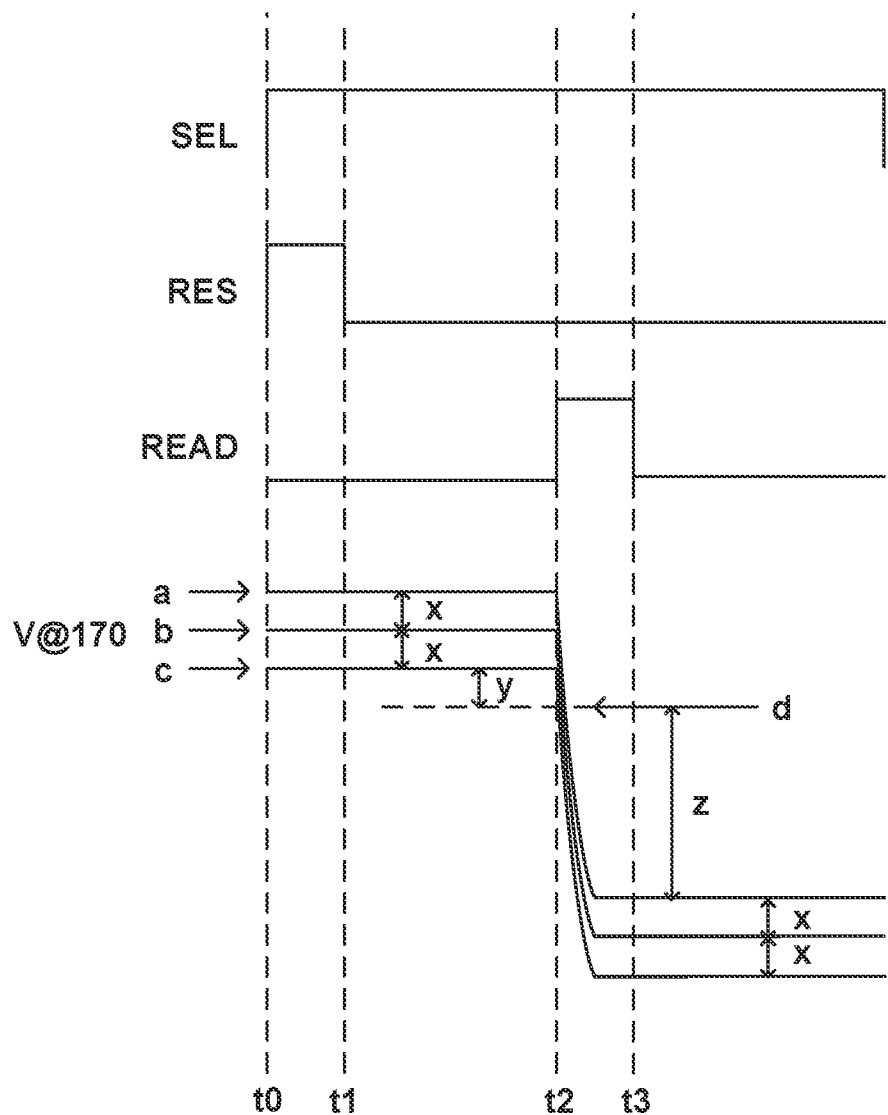
FIG. 9 is a view exemplarily showing a waveform representing an operation of the pixel related to a clip operation.

With reference to FIGS. 7 to 9, a photoelectric conversion device 1 according to the third embodiment will be described below. Matters not mentioned as the third embodiment can follow the first or second embodiment. In the third embodiment, a clip circuit CL includes a plurality of transistors 610 and 620 arranged in parallel so as to form a path connecting a power supply terminal PT to a column signal line 170. The clip circuit CL further includes a selection circuit which selects the transistor to be used for a clip operation from the plurality of transistors 610 and 620. The selection circuit can include, for example, a switch 630 arranged in a path connecting the power supply terminal PT to the transistor 610, and a switch 640 arranged in a path connecting the power supply terminal PT to the transistor 620. An adjuster 600 can adjust the driving capability of the clip circuit CL by controlling the selection circuit based on control information set in advance.

The transistors 610 and 620 can have different characteristics so as to have different driving capabilities. For example, at least one of a threshold, a gate width, and a gate length is different between the transistors 610 and 620. The control information described above can be set in advance in accordance with the process variation of a pixel 100 on a first substrate 10 or the like. More specifically, the control information can be prepared such that the transistor is selected in accordance with the threshold variation of a source follower transistor 430. Thus, a clip operation can be performed using the transistor according to the threshold of the corresponding source follower transistor 430, so that it is possible to expand the voltage range of the column signal line 170, for example.

In the third embodiment, a second substrate 20 includes a power supply pad 190 thereon, and a power supply potential applied to the power supply pad 190 is supplied to the clip circuit CL by an electrically conductive line 145 of the second substrate 20.

FIG. 9 exemplarily shows a waveform representing an operation of the pixel 100 related to the clip operation. In FIG. 9, SEL, RES, and READ indicate control signals provided to the gates of a selection transistor 440, a reset transistor 460, and a transfer transistor 410 of the pixel 100 as shown in FIG. 4, respectively. As examples of the waveform of the column signal line 170, three examples b, c are shown. a indicates the waveform in a case in which the threshold of the source follower transistor 430 is low, b indicates the waveform in a case in which the threshold of the source follower transistor 430 is standard, and c indicates the waveform in a case in which the threshold of the source follower transistor 430 is high. In FIG. 9, x depends on the threshold variation of the source follower transistor 430, and this depends on the process.

At time t0, SEL and RES are at high level, and the selection transistor 440 and the reset transistor 460 are turned on. Accordingly, a signal corresponding to the potential of a charge-voltage converter 420 can be output to the column signal line 170, and the potential of the charge-voltage converter 420 is reset. At time t1, RES is set at low level so that the reset of the charge-voltage converter 420 is terminated. At time t2, READ is set at high level and the transfer transistor 410 is turned on, so that charges accumulated in a photoelectric converter 400 are transferred to the charge-voltage converter 420, and the potential of the charge-voltage converter 420 decreases. This causes a decrease in potential of the column signal line 170. At time t3, READ is set at low level, so that the transfer of the charges is terminated. When the voltage range that the column signal line 170 can take is sufficient, the potential level of the column signal line 170 between time t0 and t2 and the potential level of the column signal line 170 after time t3 are determined by the voltage range of the charge-voltage converter 420. Then, the potential level of the column signal line 170 changes as indicated by a, b, and c in accordance with the threshold variation of the source follower transistor 430.

In FIG. 9, d indicates a level at which the potential of the column signal line 170 is clipped by the transistor 610 or 620 when the potential of the column signal line 170 decreases since blooming occurs in the photoelectric converter 400 and charges flow into the charge-voltage converter 420 before READ is set at high level. A potential difference y is provided between c and d in order to avoid that the transistor 610 or 620 is slightly turned on without occurrence of blooming so that an error is generated in the potential of the column signal line 170.

In FIG. 9, the voltage range indicated by z is the usable signal voltage range, which is limited by the threshold variation of the source follower transistor 430. Therefore, in the third embodiment, the plurality of transistors 610 and 620 having different driving capabilities are provided, and the clip transistor to be used can be selected in accordance with the process variation information of the first substrate 10. With this arrangement, the signal voltage range z can be expanded. More specifically, in the case of c shown in FIG. 9, the clip transistor having the lower driving capability is selected from the transistors 610 and 620 so as not to raise the potential indicated by d. This secures sufficient y. At this time, the signal voltage range is z+2x. On the other hand, in the case of a shown in FIG. 9, in order to avoid the signal voltage range becoming z, the clip transistor having the higher driving capability is selected from the transistors 610 and 620 so as to raise the potential indicated by d. This expands the signal voltage range z. Therefore, it becomes possible to expand the signal voltage range.

Figure 10:
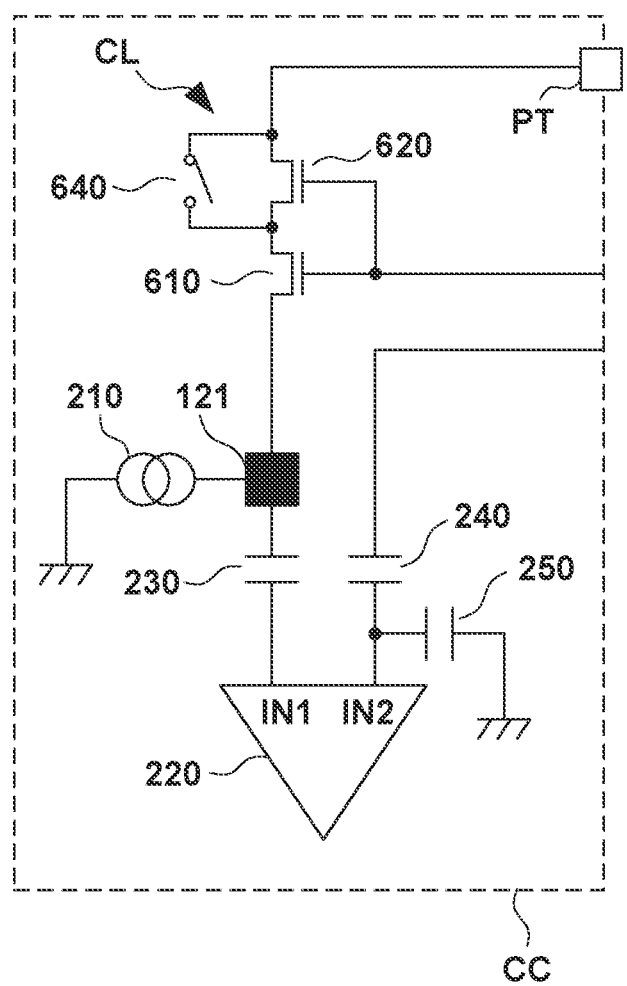
FIG. 10 is a view showing a modification of the third embodiment.

FIG. 10 shows a modification of the third embodiment. In this modification, the arrangement of the clip circuit CL is different from the arrangement of the clip circuit CL shown in FIG. 8. The clip circuit CL includes the plurality of transistors 610 and 620 arranged in series so as to form a path connecting the power supply terminal PT to the column signal line 170 (a joint portion 121). In addition, the clip circuit CL includes the switch 640 that short-circuits the source and drain of at least one of the plurality of transistors 610 and 620. The adjuster 600 adjusts the driving capability of the clip circuit CL by controlling the switch 640.

For example, the threshold of the transistor 610 is lower than the threshold of the transistor 620. When the transistor 610 alone is used, the transistor 620 is disabled by turning on the switch 640. On the other hand, when the transistor 620 is used, the switch 640 is turned off. Then, the transistors 610 and 620 are connected in series, and the total driving capability decreases.

Instead of providing the plurality of transistors 610 and 620, the driving capability of the clip circuit CL (transistor 610) may be adjusted by adjusting the bias potential applied to the transistor 610 by the adjuster 600. In this case, the adjuster 600 can generate the bias potential to be applied to the transistor 610 based on the control information set in advance in accordance with the process variation of the first substrate 10.

The representative photoelectric conversion device 1 according to the above-described embodiment can be formed as an image capturing apparatus that detects an optical image or a light intensity distribution as an electric image signal. As applications of the photoelectric conversion device 1 formed as an image capturing apparatus, an electronic equipment such as a camera, smartphone, or general-purpose computer or a transportation equipment such as an automobile in which the image capturing apparatus is incorporated will be exemplified. The camera conceptually includes not only an apparatus whose principal purpose is shooting but also an apparatus (for example, a personal computer or a mobile terminal such as a tablet) additionally provided with a shooting function. Note that examples of the equipment incorporating the image capturing apparatus are an office equipment such as a copying machine or a scanner, a medical equipment for radiation diagnosis or endoscope observation, an industrial equipment such as an industrial robot, and an analysis equipment such as an electron microscope.

Figure 11:
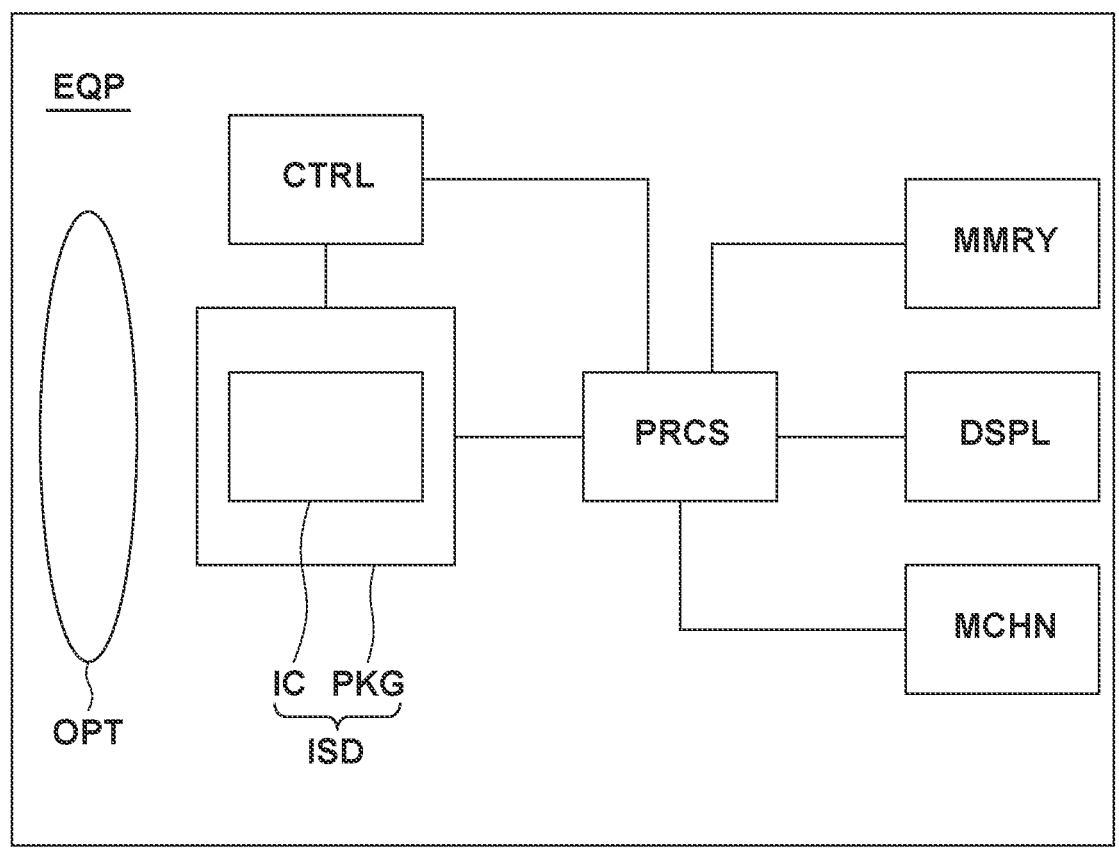
FIG. 11 is a block diagram showing the arrangement of an equipment according to an embodiment.

FIG. 11 is a schematic view showing an equipment EQP mounted with the photoelectric conversion device 1 formed as an image capturing apparatus ISD. An example of the equipment EQP is an electronic equipment (information equipment) such as a camera or smartphone or a transportation equipment such as an automobile, ship, or airplane. The image capturing apparatus ISD can include a package PKG that stores a semiconductor device IC in addition to the semiconductor device IC including a semiconductor substrate (semiconductor chip). The package PKG can include a base on which the semiconductor device IC is fixed, a lid made of glass or the like facing the semiconductor device IC, and a connection member such as a bonding wire and bump for connecting a terminal of the base and a terminal of the semiconductor device IC. The equipment EQP can further include at least one of an optical system OPT, a control apparatus CTRL, a processing apparatus PRCS, a display apparatus DSPL, and a storage apparatus MMRY. The optical system OPT is a system that forms an optical image on the image capturing apparatus ISD and is implemented by, for example, a lens, a shutter, and a mirror. The control apparatus CTRL controls the operation of the image capturing apparatus ISD and is, for example, a semiconductor device such as an ASIC. The processing apparatus PRCS processes a signal output from the image capturing apparatus ISD and is a semiconductor device such as a CPU or ASIC for forming an AFE (Analog Front End) or a DFE (Digital Front End). The display apparatus DSPL is an EL display apparatus or liquid crystal display apparatus that displays information (image) obtained by the image capturing apparatus ISD. The storage apparatus MMRY is a magnetic device or semiconductor device that stores the information (image) obtained by the image capturing apparatus ISD. The storage apparatus MMRY is a volatile memory such as an SRAM or DRAM or a nonvolatile memory such as a flash memory or hard disk drive. A mechanical apparatus MCHN includes a moving or propulsion unit such as a motor or engine. The mechanical apparatus MCHN in the camera can drive the components of the optical system OPT in order to perform zooming, an in-focus operation, and a shutter operation. The equipment EQP displays the signal output from the image capturing apparatus ISD on the display apparatus DSPL and performs external transmission by a communication apparatus (not shown) of the equipment EQP. For this purpose, the equipment EQP may further include the storage apparatus MMRY and the processing apparatus PRCS in addition to the memory circuits and arithmetic circuits included in the control/signal processing circuits in which the image capturing apparatus ISD can be incorporated.

Figure 12A:
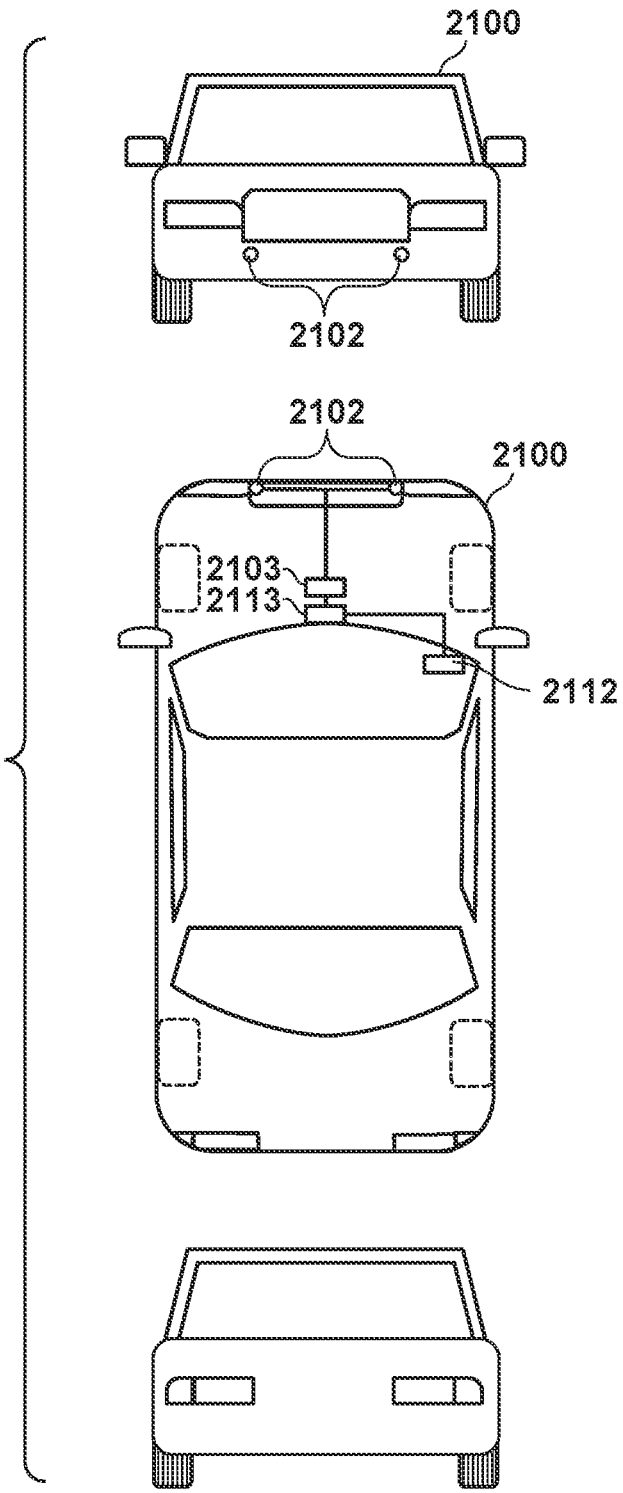
FIGS. 12A and 12B are views showing the arrangement of an equipment according to another embodiment.

As described above, the photoelectric conversion device 1 is advantageous in reducing shading. Therefore, a camera incorporating the photoelectric conversion device 1 is suitable as a surveillance camera, an onboard camera mounted in a transportation equipment such as an automobile or railroad car, or the like. An example in which the camera incorporating the photoelectric conversion device 1 is applied to a transportation equipment will be exemplified. A transportation equipment 2100 can be, for example, an automobile including an onboard camera system 2101 shown in FIGS. 12A and 12B. FIG. 12A schematically shows the outer appearance and the main internal structure of the transportation equipment 2100. The transportation equipment 2100 includes photoelectric conversion devices 2102, an image capturing system integrated circuit (ASIC: Application Specific Integrated Circuit) 2103, a warning apparatus 2112, and a control apparatus 2113.

The above-described photoelectric conversion device 1 is used as each photoelectric conversion device 2102. The warning apparatus 2112 warns a driver when it receives an abnormality signal from an image capturing system, a vehicle sensor, a control unit, or the like. The control apparatus 2113 comprehensively controls the operations of the image capturing system, the vehicle sensor, the control unit, and the like. Note that the transportation equipment 2100 need not include the control apparatus 2113. In this case, the image capturing system, the vehicle sensor, and the control unit each individually include a communication interface and transmit/receive control signals via a communication network (for example, CAN standards).

Figure 12B:
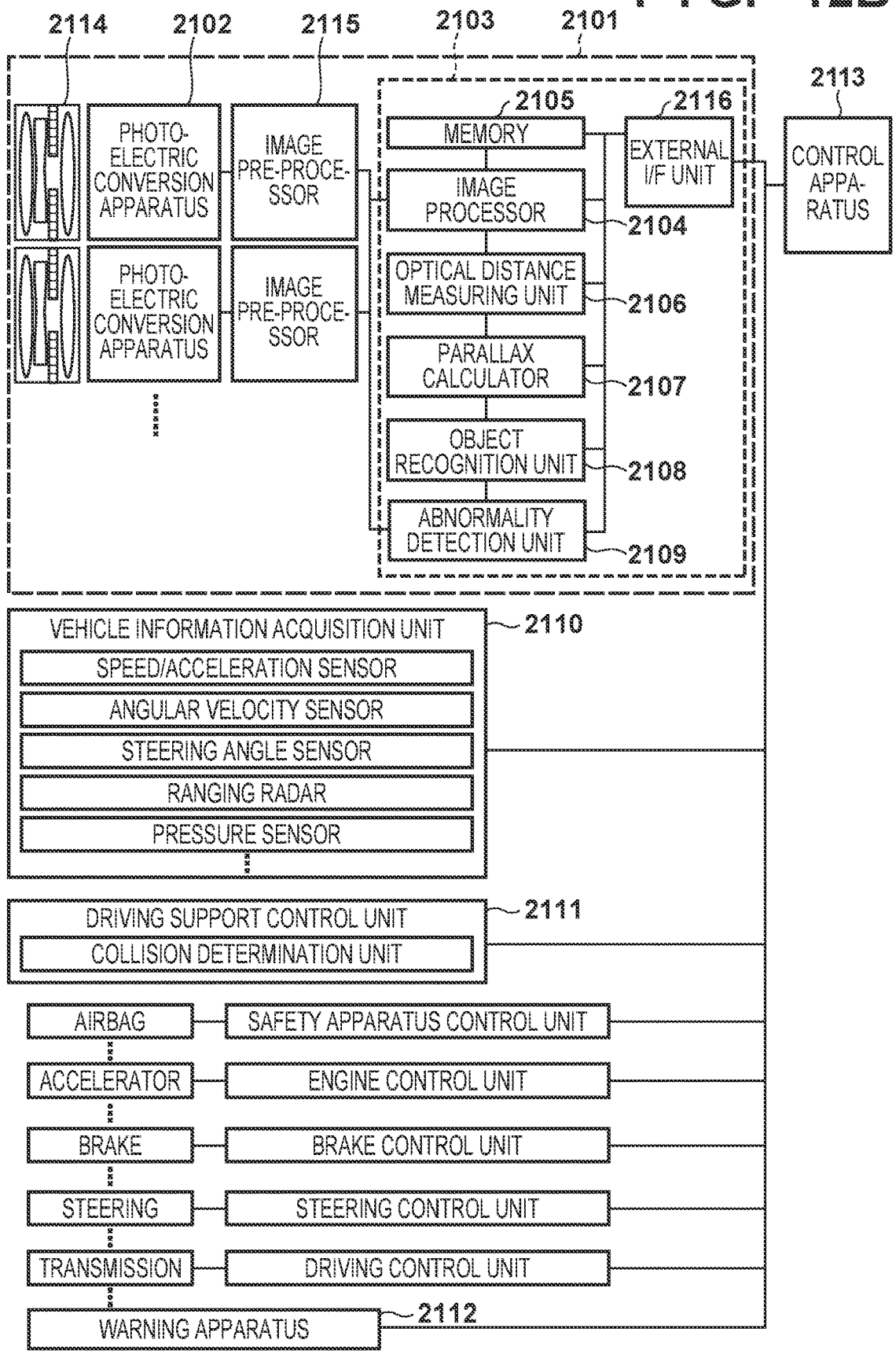

FIG. 12B is a block diagram showing the system arrangement of the transportation equipment 2100. The transportation equipment 2100 includes the first photoelectric conversion device 2102 and the second photoelectric conversion device 2102. That is, the onboard camera according to this embodiment is a stereo camera. An object image is formed by each optical unit 2114 on each photoelectric conversion device 2102. A pixel signal output from each photoelectric conversion device 2102 is processed by an image preprocessor 2115 and transmitted to the image capturing system integrated circuit 2103. The image preprocessor 2115 performs processing such as S-N calculation and synchronization signal addition. A signal processor 902 corresponds to at least part of the image preprocessor 2115 and the image capturing system integrated circuit 2103.

The image capturing system integrated circuit 2103 includes an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 generates an image signal by processing signals output from the pixels of each photoelectric conversion device 2102. The image processor 2104 also performs correction of the image signal and interpolation of an abnormal pixel. The memory 2105 temporarily holds the image signal. The memory 2105 may also store the position of a known abnormal pixel in the photoelectric conversion device 2102. The optical distance measurement unit 2106 uses the image signal to perform focusing or distance measurement of an object. The parallax calculation unit 2107 performs object collation (stereo matching) of a parallax image. The object recognition unit 2108 analyzes the image signal to recognize objects such as a transportation equipment, a person, a road sign, and a road. The abnormality detection unit 2109 detects the fault or an error operation of the photoelectric conversion device 2102. When a fault or an error operation is detected, the abnormality detection unit 2109 transmits a signal indicating the detection of an abnormality to the control apparatus 2113. The external I/F unit 2116 mediates exchange of information between the units of the image capturing system integrated circuit 2103 and the control apparatus 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. Based on the pieces of information from the optical distance measurement unit 2106, the parallax calculation unit 2107, and the object recognition unit 2108, the collision determination unit determines whether there is the possibility of a collision with an object. The optical distance measurement unit 2106 and the parallax calculation unit 2107 are examples of distance information acquisition units that acquire distance information of a target object. That is, distance information includes pieces of information concerning the parallax, the defocus amount, the distance to the target object, and the like. The collision determination unit may use one of these pieces of distance information to determine the possibility of a collision. Each distance information acquisition unit may be implemented by specially designed hardware or a software module.

An example in which the driving support unit 2111 controls the transportation equipment 2100 so as to avoid a collision with another object has been described. However, the present invention is also applicable to control for automated driving following another vehicle or automated driving without deviation from a lane.

The transportation equipment 2100 also includes driving apparatuses which are used for movement or for supporting the movement, such as an air bag, an accelerator, a brake, a steering wheel, a transmission, an engine, a motor, wheels, and propellers. The transportation equipment 2100 also includes control units for these apparatuses. Each control unit controls a corresponding driving apparatus based on a control signal of the control apparatus 2113.

The image capturing system used in this embodiment is applicable not only to an automobile and a railroad car but also to, for example, an equipment such as a ship, an airplane, or an industrial robot. In addition, the image capturing system is applicable not only to a transportation equipment but also to an equipment that widely uses object recognition, such as ITS (Intelligent Transportation System).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133125, filed Jul. 18, 2019, which is hereby incorporated by reference herein in its entirety.

What is claimed is:

1. A photoelectric conversion device including a first substrate and a second substrate stacked on each other, wherein
the first substrate includes a pixel array having a plurality of pixels, a first joint portion arranged in the pixel array and connected to at least one pixel of the plurality of pixels on the first substrate, and a third joint portion connected to the first joint portion,
the second substrate includes a readout circuit configured to read out a signal from the pixel array via a signal line, a second joint portion jointed to the first joint portion, a fourth joint portion jointed to the third joint portion, and a power supply pad connected to the second joint portion, wherein the readout circuit includes a limiter circuit configured to limit an amplitude of a potential of the signal line, and a power supply terminal of the limiter circuit is connected to the second joint portion, and
a power supply potential applied to the power supply pad is supplied to the at least one pixel and the power supply terminal of the limiter circuit via the first joint portion, the second joint portion, the third joint portion, and the fourth joint portion.

2. The device according to claim 1, wherein the at least one pixel to which the first joint portion is connected and the limiter circuit in which the second joint portion is connected to the power supply terminal are connected to the same signal line.

3. The device according to claim 1, further comprising an adjusting circuit configured to select a driving capability to be used for the limiter circuit from a plurality of driving capabilities.

4. The device according to claim 1, wherein the readout circuit includes a differential amplifier including a first input terminal to which a signal is supplied from the signal line and a second input terminal to which a reference potential is supplied.

5. The device according to claim 4, wherein the readout circuit includes a current source arranged in a path connecting the signal line to a ground potential, a first capacitor arranged in a path connecting the signal line to the first input terminal, a second capacitor arranged in a path connecting a supply source of the reference potential to the second input terminal, and a third capacitor arranged in a path connecting the second input terminal to the ground potential.

6. An equipment comprising:
a photoelectric conversion device defined in claim 1, and
an apparatus connected to the photoelectric conversion device.

7. The device according to claim 1, wherein the power supply pad is not directly connected to the power supply terminal of the limiter circuit on the second substrate.

8. A photoelectric conversion device including a first substrate and a second substrate stacked on each other, wherein
the first substrate includes a pixel array including a plurality of pixels,
the second substrate includes a readout circuit configured to read out a signal from the pixel array via a signal line, the readout circuit includes a limiter circuit configured to limit an amplitude of a potential of the signal line, and
an adjusting circuit configured to select a driving capability to be used for the limiter circuit from a plurality of driving capabilities is provided.

9. The device according to claim 8, wherein the adjusting circuit is arranged on the second substrate.

10. The device according to claim 9, wherein a power supply potential is supplied to the adjusting circuit via a power supply pad arranged on the second substrate.

11. The device according to claim 9, wherein
the limiter circuit includes a transistor arranged so as to form a path connecting a power supply terminal of the limiter circuit to the signal line, and
the adjusting circuit is configured to adjust a potential applied to a gate of the transistor.

12. The device according to claim 9, wherein
the limiter circuit includes a plurality of transistors arranged in parallel so as to form a path connecting a power supply terminal of the limiter circuit to the signal line, and a selection circuit configured to select the transistor to be used for a clip operation from the plurality of transistors, and
the adjusting circuit adjusts a driving capability of the limiter circuit by controlling the selection circuit based on control information.

13. The device according to claim 9, wherein
the limiter circuit includes a plurality of transistors arranged in series so as to form a path connecting a power supply terminal of the limiter circuit to the signal line, and a switch configured to short-circuit a source and a drain of at least one transistor of the plurality of transistors, and
the adjusting circuit adjusts a driving capability of the limiter circuit by controlling the switch.

14. The device according to claim 8, wherein the readout circuit includes a differential amplifier including a first input terminal to which a signal is supplied from the signal line and a second input terminal to which a reference potential is supplied.

15. The device according to claim 14, wherein the readout circuit includes a current source arranged in a path connecting the signal line to a ground potential, a first capacitor arranged in a path connecting the signal line to the first input terminal, a second capacitor arranged in a path connecting a supply source of the reference potential to the second input terminal, and a third capacitor arranged in a path connecting the second input terminal to the ground potential.

16. An equipment comprising:
a photoelectric conversion device defined in claim 8, and
an apparatus connected to the photoelectric conversion device.

* * * * *